United States Patent
Searls et al.

(10) Patent No.: US 6,856,016 B2
(45) Date of Patent: Feb. 15, 2005

(54) METHOD AND APPARATUS USING NANOTUBES FOR COOLING AND GROUNDING DIE

(76) Inventors: Damion T. Searls, 6355 NE. Brighton St., Hillsboro, OR (US) 97124; Terrance J. Dishongh, 6934 SE. Reedville Creek Dr., Hillsboro, OR (US) 97123; James Daniel Jackson, 14815 SW. Vulcan Ct., Beaverton, OR (US) 97007

(*) Notice: Subject to any disclaimer, the term of this patent is extended or adjusted under 35 U.S.C. 154(b) by 0 days.

(21) Appl. No.: 10/187,513

(22) Filed: Jul. 2, 2002

(65) Prior Publication Data

US 2004/0005736 A1 Jan. 8, 2004

(51) Int. Cl.[7] .................... H01L 23/10; H01L 23/34; H01L 23/26; H05K 7/20; F28F 7/00
(52) U.S. Cl. .................... 257/720; 257/717; 257/712; 257/706; 165/185; 174/16.3; 361/704
(58) Field of Search .................... 361/704, 707, 361/709; 174/16.3; 165/185; 257/720, 701, 702, 706, 717, 712

(56) References Cited

U.S. PATENT DOCUMENTS

| | | | |
|---|---|---|---|
| 5,753,088 A | 5/1998 | Olk | 204/173 |
| 5,965,267 A | 10/1999 | Nolan et al. | 428/408 |
| 6,203,814 B1 | 3/2001 | Fisher et al. | 424/443 |
| 6,232,706 B1 | 5/2001 | Dai et al. | 313/309 |
| 6,256,996 B1 | 7/2001 | Ghoshal | 62/3.7 |
| 6,407,922 B1 * | 6/2002 | Eckblad et al. | 361/704 |
| 2002/0090501 A1 | 7/2002 | Tobita | 428/297.4 |
| 2002/0145194 A1 | 10/2002 | O'Connor et al. | 257/712 |

FOREIGN PATENT DOCUMENTS

| | | | |
|---|---|---|---|
| EP | 1054036 | 11/2000 | C08K/7/24 |
| EP | 1109218 | 6/2001 | H01L/23/373 |
| WO | WO 00/33628 | * 5/2000 | H05K/7/20 |
| WO | WO-00/33628 | 6/2000 | H05K/7/20 |
| WO | WO-01/30694 | 5/2001 | C01B/31/02 |
| WO | WO-01/92381 | 12/2001 | C08J/5/04 |

OTHER PUBLICATIONS

Andrews, R., "Nanotube Composite Carbon Fibers", *Applied Physics Letters*, 75, (Aug. 30, 1999), pp. 1329–1331.

King, J A., et al., "Factorial Design Approach Applied To Electrically And Thermally Conductive Nylon 6,6", *Polymer Composites, vol. 22, No. 1*, Brookfield, CT, US, (Feb. 2001), 142–154.

* cited by examiner

*Primary Examiner*—Nathan J. Flynn
*Assistant Examiner*—Victor A. Mandala, Jr.

(57) ABSTRACT

An embodiment of the present invention described and shown in the specification and drawings is a process and a package for facilitating cooling and grounding of a semiconductor die using carbon nanotubes in a thermal interface layer between the die and a thermal management aid. The embodiments that are disclosed have the carbon nanotubes positioned and sized to utilize their high thermal and electrical conductance to facilitate the flow of heat and current to the thermal management aid. One embodiment disclosed has the carbon nanotubes mixed with a paste matrix before being applied. Another disclosed embodiment has the carbon nanotubes grown on the surface of the semiconductor die.

23 Claims, 3 Drawing Sheets

METHOD AND APPARATUS USING NANOTUBES FOR COOLING AND GROUNDING DIE

The present invention pertains generally to thermal management of an integrated circuit package containing at least one die, and in particular to methods and apparatus for providing thermal and electrical connection between a die and a thermal management aid using an array of carbon nanotubes.

Several embodiments of a method and an integrated circuit package for providing cooling and grounding for a semiconductor die are disclosed. In the following description numerous specific details are set forth in order to provide a thorough understanding of the various embodiments of the present invention. It will be apparent, however, to one having ordinary skill in the art that the specific detail need not be employed to practice the various aspects of the present invention. In other instances, well known materials and processes have not been described in detail in order to avoid obscuring the embodiments of the present invention.

Figure 1:
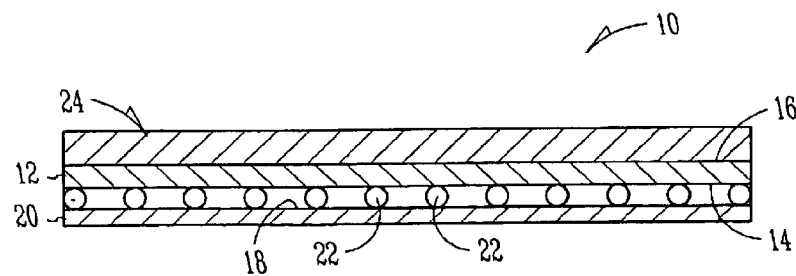
FIG. 1 is an elevation view of an integrated circuit package according to an embodiment of the present invention showing a die thermally coupled to a thermal management aid.

FIG. 1 is a simplified schematic elevation view of an embodiment of a package 10 for mounting and cooling a heat generating component 12 that is supported by a mounting structure 20.

In one embodiment, component 12 may also comprise at least one active element such as a component, a module or an active circuit formed on a front surface 14 of component 12 which may be a semiconductor die 12. When it is stated that an active element is formed on a front surface of a die, it will be understood that the circuit may be above, on, in or even slightly below the surface referred to. In the embodiment shown in FIG. 1, die 12 has a front surface 14 thereof affixed to socket 20 by a ball grid assembly comprised of a plurality of solder balls 22 which are bonded to surface 14 of die 12. The other, or backside, surface 16 of die 12 is shown connected to a thermal management aid, such as an integrated heat spreader 24 as shown in the embodiment of FIG. 1. Other thermal management aids may include heat sinks or other similar structures. Typical thermal management aids are formed from relatively soft conductive materials such as copper or copper alloys.

Figure 2:
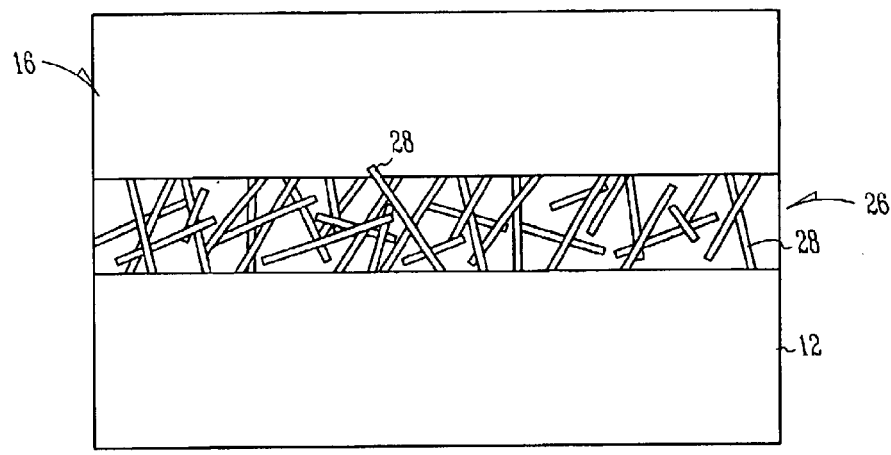
FIG. 2 is an elevation view showing a die, a thermal management aid and an interface layer.

FIG. 2 is an enlarged detail elevation view of an interface layer 26 between the backside surface 16 of die 12 and the thermal management aid such as an integral heat spreader 24. In order to provide for efficient thermal transmission from die 12 to heat spreader 24, a thermal interface layer 26, having very high heat conductivity in one embodiment, is interposed between elements 12 and 24. In the embodiment shown in FIG. 2, thermal interface layer 26 is comprised of an array of carbon nanotubes 28 which are mixed with a paste and applied between backside 16 of die 12 and thermal management aid 24.

A distribution of nanotube lengths is selected to allow substantial percentage of nanotubes 28 to bridge the gap between the die 12 and the heat spreader 24 and form a direct path to provide for optimal thermal coupling between die 12 and heat spreader 24. FIG. 2 illustrates, in greatly enlarged and expanded form, the relationship between the lengths of nanotubes 28 and the thickness of interface layer 26. Typically the nanotubes have a diameter on the order of 1 nanometer. The thickness of interface layer 26 is from tens to hundreds of nanometers thick, depending upon the nanotube lengths available. The lengths of the nanotubes in one embodiment slightly exceed the thickness of interface layer 26 and the thickness of the thermal interface layer is less than about 0.01 to 0.10 mm.

Figure 3:
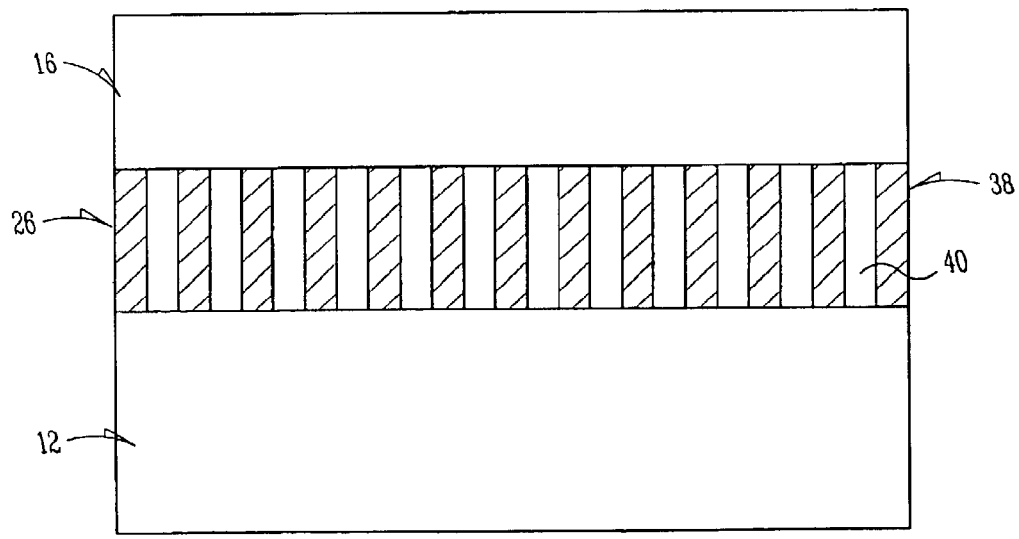
FIG. 3 is an elevation view showing a semiconductor die, a thermal management aid and an interface layer.

FIG. 3 illustrates another embodiment of the interface layer 26 that also has an array of carbon nanotubes that, in this embodiment, are arranged in a plurality of individual bundles of nanotubes 38. In this embodiment the nanotubes 38 are grown directly on the backside surface 16 of die 12 using a chemical vapor deposition (CVD) process. The process is set up and controlled to produce bundles of nanotubes 38 which each have their longitudinal axis perpendicular to the surface of die 12. This orientation is optimal as the heat condition is optimal along the axis of nanotubes 38 and can be as high as 6000 W/mK as compared to a value of about 400 for copper. The lengths of the bundles of nanotubes 38 are in the order of several micrometers.

Figure 4:
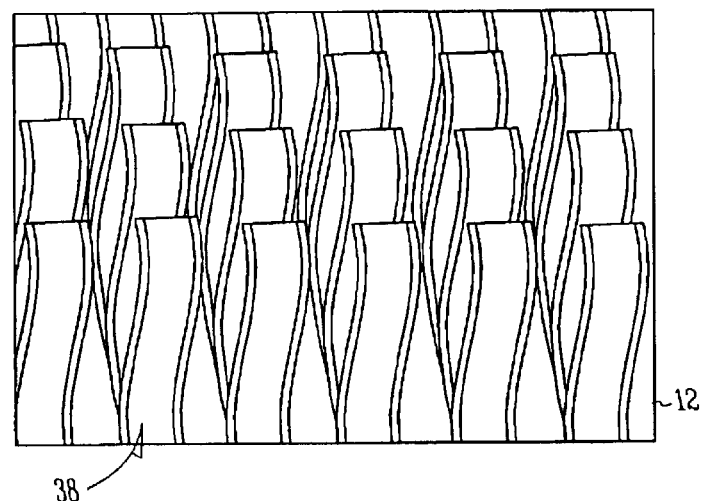
FIG. 4 is an enlarged perspective elevation view of the interface layer of FIG. 3 with the thermal management aid removed.

If nanotubes 38 are grown together in bundles, as illustrated in the perspective view of FIG. 4, the mechanical strength of the bundles is greatly increased over that of individual nanotubes so that it is easier to grow the nanotubes from a surface such as the surface of die 12. In order to provide mechanical strength to interface layer 24, an interstitial material 40 can be applied to the bundles of nanotubes 38 after they have been grown. A number of thermal pastes or polymers can serve as suitable interstitial material 40.

In one embodiment, the thermal conductance from the active elements on the front of the die to the thermal management aid is further reduced by mechanically grinding of the backside surface or otherwise providing for a thinning of the die from the surface not containing the active elements.

In order to avoid damage to active elements formed on die 12, the CVD process of growing bundles of nanotubes on die 12 should, according to an embodiment of the invention, be carried out prior to the fabrication of active circuits on die 12 in order to avoid exposing the active elements to the high temperatures of the CVD process.

In some embodiments, the high tensile strength of the nanotubes allows their tips to be embedded in the surface of the soft thermal management aid such as a heat sink of the integral heat spreader if they are allowed to project from the surface of the interstitial material.

In some embodiments the material for the thermal management aid is copper or an alloy of copper having a high copper content. This allows the thermal interface layer to compensate for surface roughness of the thermal management aid or the die. Additionally, the projection of the nanotubes beyond the surface of the interstitial material allows the tips of the nanotubes to impinge upon the surface of the thermal management aid in the "valleys" in the surface which are a consequence of the surface roughness.

In some embodiments the tips of the nanotubes can impinge into the copper surface itself. In other embodiments the nanotubes impinge into the surface of the thermal management aid through a layer of solder coating the surface. The solder may be softer than the surface of the thermal management aid. In other embodiments, the surface of the thermal management aid may have a nickel or nickel alloy layer upon which there is a tinned solder layer to receive the projecting tips of the nanotubes.

In another embodiment the integrated heat spreader is heated so that a portion of it is molten at the time that the surface is connected to the nanotubes projecting from the interstitial layer. In this embodiment the mechanical stress on the nanotubes inserted into the soft surface of the thermal management aid is reduced.

Because the carbon nanotubes 28 and 38 are highly conductive electrically as well as thermally, interface layer 26, in one embodiment, can also be used to provide a ground connection between die 12 and component socket 20. Providing such a connection supplements grounding connections through solder ball connections to a mounting socket and allows for reducing the package size because not as much of the real estate needs to be committed to providing multiple conventional ground connections.

Figure 5:
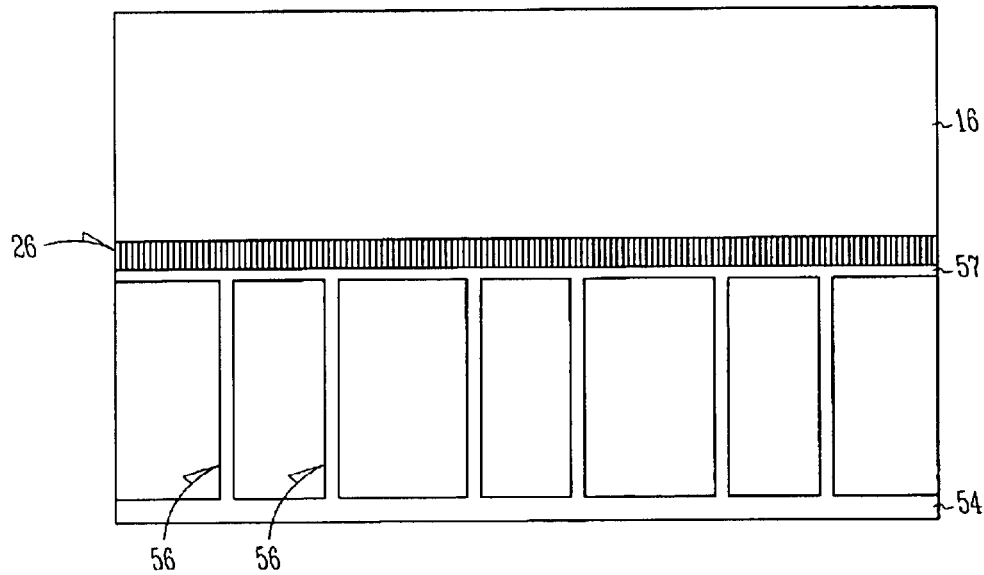
FIG. 5 is an elevation schematic view showing another embodiment of the present invention where the thermal interface material also provides a grounding connection to active elements on the semiconductor die.

FIG. 5 illustrates schematically the provision of a ground connection through interface layer 24. In this embodiment active elements circuits are on the front side 54 of die 12. A plurality of vias 56 are provided through die 12 from the active elements on the front side to the backside 57 of die 12 which, in this embodiment, is metallized over at least a portion of its surface to improve the grounding path from active elements on the front side of die 12 to the die backside.

Figure 6:
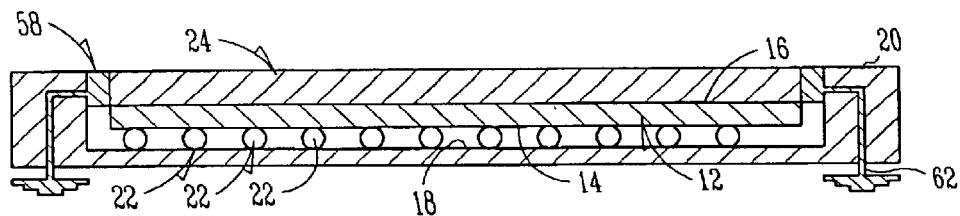
FIG. 6 is an elevation view of a package showing an embodiment of the invention showing a die thermally and electrically coupled to a thermal management aid and showing provision of grounding through a modified integral heat spreader and socket.

FIG. 6 shows a socket for supporting the die and providing electrical paths from a die to the socket. In this embodiment, further contacts 58 are provided on socket 20 for engaging at least one side of the integral heat spreader 24 and conduct electrical current to connectors 60. to be connected to further circuitry external to socket 20 through conductive paths 62. In one embodiment connectors are connected to a source of reference potential such as ground.

Figure 7:
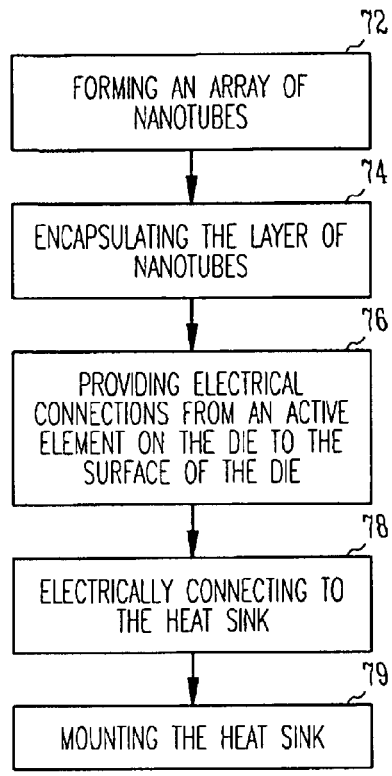
FIG. 7 is a flow chart of a process for coupling a die to a thermal management aid.

FIG. 7 is a flow chart of an embodiment of a process to couple a die to a thermal management aid. An array of nanotubes is formed 72 on a surface of the die and a thermal management aid is mounted 79 in contact with the array of nanotubes.

In another embodiment, the array of nanotubes is encapsulated 74 along substantially the entire length of a substantial portion of the nanotubes with only the tips of the nanotubes projecting from a surface of the interstitial material to facilitate embedding the tips into the surface and into the surface roughness of the thermal management solution to form an interface layer.

In another embodiment, electrical connections may be provided from one or more active elements on the die to a surface of the die 76 and electrically connecting the die through the thermal management aid to a source of reference potential 78.

Figure 8:
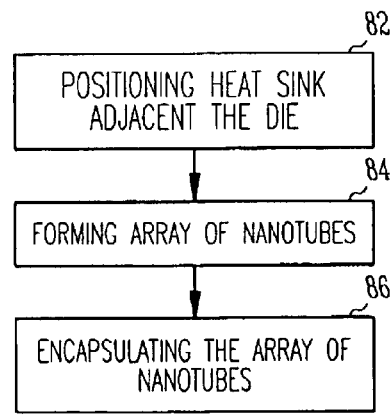
FIG. 8 is a flow chart of a process for providing a thermal path between a die and a thermal management aid.

FIG. 8 is a flow chart of a process to provide a thermal conductive path from a die to a thermal management aid. The process comprises forming an array 82 of nanotubes on a surface of the die and mounting the thermal management aid 84 in contact with the array of nanotubes to couple the array of nanotubes to the thermal management aid.

In a further embodiment the process also comprises encapsulating the layer of nanotubes 86 with interstitial material along substantially the entire length of a substantial portion of the nanotubes with only the tips of the nanotubes projecting from a surface of the interstitial material to facilitate embedding the tips into the surface and into the surface roughness of the thermal management solution.

It should be understood that the preceding is merely a detailed description of some embodiments of this invention and that numerous changes to the disclosed embodiments can be made in accordance with the disclosure herein without departing from the spirit or scope of the invention. The preceding description, therefore, is not meant to limit the scope of the invention. Rather, the scope of the invention is to be determined solely by the appended claims and their equivalents.

We claim:

1. An integrated circuit package, comprising a die; a thermal management aid mounted above the die; and an interface layer thermally coupling the die and the thermal management aid, the interface layer further comprising an array of carbon nanotubes aligned substantially perpendicular to the die and the thermal management aid and wherein the array of carbon nanotubes is encapsulated in a matrix of interstitial material.

2. The package of claim 1, wherein the interstitial material is a thermally conductive paste.

3. The package of claim 1, wherein the thermal management aid is a heat sink.

4. The package of claim 1, wherein the thermal management aid is an integral heat spreader.

5. An integrated circuit package, comprising a die; a thermal management aid mounted above the die; and an interface layer thermally coupling the die and the thermal management aid, the interface layer further comprising an array of carbon nanotubes wherein the thickness of the interface layer is less than about 0.01 mm to 0.10 mm.

6. An integrated circuit package, comprising a die; a thermal management aid mounted above the die; and an interface layer thermally coupling the die and the thermal management aid, the interface layer further comprising an array of carbon nanotubes wherein the array of carbon nanotubes is encapsulated in a matrix of interstitial material and wherein the length of a substantial portion of the nanotubes slightly exceeds the thickness of the interstitial material to allow a substantial portion of the nanotubes to be wedged between the die and the thermal management aid to conduct heat from the die primarily through the nanotubes rather than through the surrounding interstitial material.

7. An integrated circuit package, comprising a die; a thermal management aid mounted above the die; and an interface layer thermally coupling the die and the thermal management aid, the interface layer further comprising an array of carbon nanotubes wherein the array of carbon nanotubes is encapsulated in a matrix of interstitial material, wherein the thermal management aid is formed from a metal having a softness substantially less than the hardness of the nanotubes and wherein the interstitial material encapsulates a substantial portion of the length of at least a portion of the array of nanotubes with the exception of the extreme ends of at least some of the nanotubes which are constructed and arranged to extend from the surface of the interstitial material and which have a diameter to facilitate embedding the ends of the nanotubes in the surface of the thermal management aid.

8. An integrated circuit package, comprising a die;
a thermal management aid mounted above the die; and
an interface layer thermally coupling the die and the thermal management aid, the interface layer further comprising an array of carbon nanotubes wherein the array of carbon nanotubes is encapsulated in a matrix of interstitial material and wherein the interface layer is electrically conductive to couple a surface of the die to a source of reference potential carried by the thermal management aid.

9. The package of claim 8, wherein the source of reference potential is a terminal connected to electrical ground.

10. The package of claim 9, wherein the surface of the die is coupled to at least one ground terminal for at least one active element within the die.

11. A thermal interface layer for use as an intermediate in manufacturing a circuit package containing a die and a thermal management aid, the layer comprising:
an array of carbon nanotubes oriented with longitudinal axes of a substantial percentage of the nanotubes having an orientation substantially perpendicular to the first and second surface thereof; and
a matrix of interstitial material substantially encapsulating the nanotubes with the exception of the tips of the nanotubes projecting from at least one of the first and second surfaces thereof to be embedded into at least one of the thermal management aid and the die.

12. The invention of claim 11 wherein a substantial percentage of the nanotubes of the array of carbon nanotubes have a substantially common orientation with their longitudinal form a direct thermal path from a first to a second surface.

13. The intermediate of claim 11, wherein the array of carbon nanotubes is comprised of bundles of similarly aligned carbon nanotubes projecting from the surface of the die.

14. The intermediate of claim 11, wherein the array of nanotubes is a plurality of individual carbon nanotubes.

15. A process for coupling a die to a thermal management aid, comprising:
forming an array of nanotubes on a surface of the die; and
mounting the thermal management aid adjacent and in contact with the array of nanotubes to couple the die to the thermal management aid; and
providing electrical connections from at least one active circuit on the die to the surface of the die and utilizing the interface layer to electrically connect the die through the thermal management aid to a source of reference potential.

16. The process of claim 15, also comprising encapsulating the layer of nanotubes with interstitial material along substantially the entire length of a substantial portion of the nanotubes with only the tips of the nanotubes projecting from a surface of the interstitial material to facilitate embedding the tips into the surface and into the surface roughness of the thermal management solution.

17. The process of claim 15, wherein forming the array of nanotubes comprises growing bundles of nanotubes on the surface of the die.

18. The process of claim 15, wherein forming the array of nanotubes comprises mixing a plurality of carbon nanotubes in a paste and applying the paste between the surface of the die and the thermal management aid.

19. A process for coupling a die to a thermal management aid, comprising:
forming an array of nanotubes on a surface of the die wherein the die is milled to move the surface closer to at least one active circuit within the die; and
mounting the thermal management aid adjacent and in contact with the array of nanotubes to couple the die to the thermal management aid.

20. A process for coupling a die to a thermal management aid, comprising:
forming an array of nanotubes on a surface of the die forming the layer of nanotubes on a back surface of the die precedes fabrication of active devices on the front surface of the die; and
mounting the thermal management aid adjacent and in contact with the array of nanotubes to couple the die to the thermal management aid.

21. A process for providing a thermal conduction path from circuit die to a thermal management aid, the process comprising:
positioning the thermal management aid adjacent the die; and
forming an array of nanotubes by a chemical vapor deposition process, the array positioned between the surface of the die and the thermal management aid with the layer of nanotubes providing a thermal conduction path between the die and the thermal management aid.

22. The process of claim 21, wherein forming the array of nanotubes comprises mixing a plurality of nanotubes in a paste and applying the mixture to a surface of the die.

23. The process of 21, wherein forming the array of nanotubes comprises forming a plurality of bundles of nanotubes on the surface of the die.

* * * * *

UNITED STATES PATENT AND TRADEMARK OFFICE
CERTIFICATE OF CORRECTION

PATENT NO. : 6,856,016 B2
APPLICATION NO. : 10/187513
DATED : February 15, 2005
INVENTOR(S) : Searls et al.

It is certified that error appears in the above-identified patent and that said Letters Patent is hereby corrected as shown below:

On the title page, in column 1, line 11, below "(US) 97007" insert -- (73) Assignee: Intel Corporation, Santa Clara, CA (US) --.

On the title page, in column 2, line 20, below "Assistant Examiner" insert -- (74) Attorney, Agent or firm -- Schwegman, Lundberg, Woessner & Kluth, P.A. --.

In column 5, line 23, in Claim 11, after "as" delete "an" and insert -- a --, therefor.

In column 6, line 47, in Claim 22, delete "claim 21" and insert -- claim 23 --, therefor.

In column 6, line 50, in Claim 23, delete "21" and insert -- claim 21 --, therefor.

Signed and Sealed this

Seventh Day of November, 2006

JON W. DUDAS
*Director of the United States Patent and Trademark Office*